(12) United States Patent
Prusseit et al.

(10) Patent No.: US 7,760,067 B2
(45) Date of Patent: Jul. 20, 2010

(54) RESISTIVE CURRENT LIMITER

(75) Inventors: Werner Prusseit, Ismaning (DE); Helmut Kinder, Freising (DE)

(73) Assignee: Theva Dunnschichttechnik GmbH, Ismaning (DE)

( * ) Notice: Subject to any disclaimer, the term of this patent is extended or adjusted under 35 U.S.C. 154(b) by 1039 days.

(21) Appl. No.: 11/396,920

(22) Filed: Apr. 4, 2006

(65) Prior Publication Data

US 2007/0205857 A1 Sep. 6, 2007

(30) Foreign Application Priority Data

Mar. 2, 2006 (EP) .................................. 06 004 214

(51) Int. Cl.
*H01C 7/00* (2006.01)
(52) U.S. Cl. ...................... 338/13; 338/210; 174/125.1; 361/19; 361/58
(58) Field of Classification Search ............ 338/13, 338/14, 32 SD, 210, 212; 335/216, 261; 174/125.1; 361/19, 58, 325; 505/704, 705
See application file for complete search history.

(56) References Cited

U.S. PATENT DOCUMENTS

| | | | | |
|---|---|---|---|---|
| 3,715,703 A | * | 2/1973 | Croso et al. | ............... 338/32 S |
| 5,204,650 A | * | 4/1993 | Nemoto | ...................... 335/216 |
| 6,472,966 B1 | | 10/2002 | Ehrhart et al. | |
| 6,522,236 B1 | | 2/2003 | Ries | |
| 6,552,415 B1 | | 4/2003 | Paul et al. | |

FOREIGN PATENT DOCUMENTS

| | | |
|---|---|---|
| DE | 197 20 397 | 4/1999 |
| DE | 198 27 225 | 12/1999 |
| DE | 198 36 860 | 2/2000 |
| DE | 199 39 066 | 3/2001 |
| DE | 102 25 935 | 1/2004 |
| DE | 102 30 618 | 1/2004 |
| EP | 1 042 820 | 3/2003 |
| EP | 0 935 261 | 4/2005 |

\* cited by examiner

*Primary Examiner*—Kyung Lee
(74) *Attorney, Agent, or Firm*—Nixon & Vanderhye P.C.

(57) ABSTRACT

According to a first aspect the present invention relates to a fault current limiter formed by a conductor tape (11, 41, 51, 61, 71) coated with a high temperature superconductor and having at least one mounting element (12, 42, 52, 62, 72) which is essentially holding the conductor tape solely on one or more edge regions in such a way that the principal surfaces of the tape cannot get in touch with the mounting element.

Figure 1:
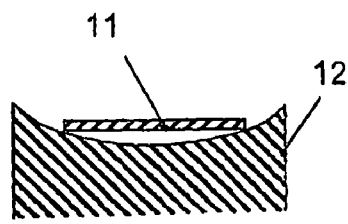

According to a second aspect the present invention relates to a fault current limiter formed by a conductor tape coated with a high temperature superconductor and comprising at least one mounting element (23, 24) which is contacting the conductor tape on one or on both major surfaces in an electrically conducting manner such that the conductor tape (21) in its normal conducting state is electrically shunted by the mounting element (23) in the contact region.

13 Claims, 13 Drawing Sheets

RESISTIVE CURRENT LIMITER

This application is a U.S. patent application claiming priority on EP 06 004 214.0 filed Mar. 2, 2006, the entire contents of which are hereby incorporated herein by reference.

TECHNICAL FIELD

The invention is related to a superconducting resistive fault current limiter.

DESCRIPTION OF THE PRIOR ART

Superconducting fault current limiters (SFCL) can be used to protect electrical installations and power grids from overload. The action of a SFCL is quite simple. During normal operation the conductor is in the superconducting state and hence nearly lossless. When overcurrent arises, the superconductor is switching very quickly into the normal conducting state where it is highly resistive and hence limits the current to an acceptable level.

The advantage of the SFCL in comparison with conventional mechanical switches are their very much shorter switching times. On the other hand they develop substantial amounts of heat in the normal state, so that they can sustain their limiting behavior for only some tens of milliseconds. Therefore there must be always a conventional mechanical switch connected in series which is eventually breaking the circuit after its longer switching time of typically 50 to 100 ms. Thereafter the superconductor cools down again and is anew ready for operation. An according setup is known, e.g. from DE 199 39066.

High temperature superconductors (HTS) are ceramic materials and hence have a high resistance in the normal state. Therefore they are particularly well suited, and a lot of work has been done to use them as SFCL in power applications since their discovery in 1986. State of the art at present are two types of SFCL, the inductive and the resistive ones. The resistive type has more advantages because of the substantially lower investment and operational cost. Resistive SFCL have been prepared either from ceramic bulk material or from thin films on insulating substrates, as described, e.g. in DE 198 27225. In both cases, material problems and cost reasons have prevented commercial use. So none of these types has been brought to the market place yet.

In the meantime, there has emerged a new type of HTS conductor, namely coated conductors (CC), sometimes also called "2G-HTS wire". A CC is a thin metal tape which serves as the substrate for, aside from some buffer layers, a HTS layer which has a typical thickness of few microns but can also be as thick as some tens of microns. In form of a thin film the brittle ceramic HTS material stays elastic and bendable, and it can sustain exceptionally high current densities. In addition, CC can be produced at relatively low cost. This opens new possibilities for the construction of SFCL which are truly fit for the market and for commercial use.

The main difference between the previous types and the CC-SFCL is the conductive metallic carrier or substrate tape. Even if highly resistive alloys such as Hastelloy® or constantan are used the total resistance of the tape is substantially lower than the resistance of the superconductor alone. Therefore long lengths of tape must be used to achieve sufficiently high resistances for high voltage switching. For instance, a voltage of 20 kV requires a tape length of typically 100 m. Consequently, the tape must be suitably arranged and mounted in order to form a compact circuit element.

A further difference to previous SFCL embodiments is the flexibility of the tape requiring new techniques of mounting. Both the flexibility and the long length are resulting in technical problems which are specific for CC-SFCL. Some of these problems can be regarded as solved at the state of the art:

Electric breakdown to substrate:
  The superconducting layer is usually separated from the metallic substrate tape by one or more electrically insulating buffer layers for technical reasons. During the limiting state large voltage drops can occur locally resulting in substantial potential differences between the superconductor and the substrate which lead to dielectric breakdown of the very thin insulating buffer layer. Therefore a suitable potential equalizer between HTS layer and substrate tape must be provided. To allow the transition of the current into the substrate in case of switching, a number of contact arrangements, continuous or in distant spots, were described, e.g. in DE 19836860, EP 1042820 or DE 10225935.

Hot spots:
  The switching level of the superconductor depends on its critical current. This is a materials property which can vary from spot to spot, typically by 20% to 50%. Therefore the switching level is reached earlier on weak spots with low critical current than in the rest of the conductor. With the overcurrent rising, these spots are first to become normal and attain resistance. Because these weak spots are of limited size, their resistance is too low, however, to limit the current efficiently. Therefore they heat up by Joule heating and destroy themselves before the rest of the conductor has become normal. Such hot spots can also occur in other types of SFCL. However in case of CC-SFCL there is a specific solution to the problem according to prior art, as described in DE 10225935.

Maximum deformation:
  HTS are brittle ceramic materials and hence sensitive to strong deformation. It is well known that first degradation, probably due to micro fracture, arises when the strain exceeds $\epsilon_{max}=0.2\%$. This implies a minimum bending radius depending on the tape thickness d according to $R_{min}=d/(2\epsilon_{max})$. For instance, at a tape thickness of 100 µm the minimum bending radius is 25 mm which must be taken into account for all designs. Because the superconductor is less sensitive to compressive than to tensile stress the superconductor layer is preferentially on the inner side of a band curvature.

Still unsolved according to the state of art are problems which are connected with the arrangement and mounting of the tapes. These are the following:

Gas development:
  The strong heat generation in the normal conducting regions leads to heavy boiling of the cryofluid, e.g. liquid nitrogen or other fluids. Due to the bubble formation there are substantial forces acting on the tape which can bend the tape and crack the superconducting layer, or they can lead to contact between different tape sections and to short circuits. Vibration damping elements between superconductor plates as described in EP 1 217 666 are not applicable to long CC tapes.

Thermal expansion:
  By heating itself up the CC expands along its length. In addition, temperature differences between the front and back side of the tape lead to bending similar to a bimetal (thermal deformation). This can result in large forces if the tape is not mounted properly. The consequences are similar to those of gas development, namely breaking of the superconductor and shorts between different tape sections.

Magnetic forces:

The electric current of the tape leads to magnetic forces between different tape sections. The forces increase with the current squared. Because current is alternating the tape can vibrate if it is improperly mounted. The forces can become excessive when overcurrent arises. The resulting problems are the same as with gas development and thermal expansion.

Overheating due to hindered coolant access:

The access of the coolant to the tape will be hindered when even small spots of the tape are touched by mounting elements or other parts. As a consequence, such areas are heating up faster than the rest. This is detrimental for the long term behaviour on a scale of some tens of milliseconds, because these areas will burn out before the mechanical switch in series with the SFCL can take over. The same holds for coils with layer on layer windings. Also in this configuration the access of coolant is hindered. Even undulating separators between layers, as described in EP 1042820, lead to obstruction of the coolant at the touching spots.

Dielectric breakdown of the coolant:

Because SFCL will be applied in high voltage installations, electric discharges, sparkover and partial discharges must be reliably prevented. Although liquid nitrogen, for example, has a very high dielectric strength, it will be considerably degraded in the presence of gas bubbles. Hence, just during the limiting state, when the coolant is boiling, there is a danger of electric breakdown between parts at different potential level.

Reduction of critical current in self field:

The critical current of superconductors decreases in magnetic fields. With an improper setup of the SFCL the current to be limited can by itself build up a field sufficiently high to lower the switching level of the SFCL substantially and hence to reduce the switching power of the device. As countermeasure for so called BSCCO-conductors it has been suggested according to prior art to use bifilar windings (EP 1042820, DE 19720397 or EP 0935261). However, due to the required spacing between windings the situation is different for CC and other measures of compensation have to be taken.

Lacking mechanical stability

The tape is flexible and has therefore no mechanical stability. Nevertheless, the configuration must sustain the forces as described above, so that the construction should work as failure-free and reliably as possible over decades.

Thus, the problem underlying the present invention is finding construction rules and arrangements for CC-SFCL which diminish at least some of the above difficulties for the operation of the SFCL.

SUMMARY OF THE INVENTION

According to a first aspect the present invention relates to a current limiter with a tape conductor which is coated with a high temperature superconductor, and with at least one mounting element which is essentially holding the conductor tape solely on one or more edge regions in such a way that the principal surfaces of the tape cannot get in touch with the mounting element. The at least one mounting element of the current limiter according to the invention is necessary in order to form compact components from long tapes. However, to allow free access of the coolant the mounting elements must touch the tape essentially only at the edges.

Preferably the mounting element consists of a hollow form where the CC extends inside. Because the tape has sufficient stiffness in transverse direction, it is then unable to touch the hollow form with its principle surfaces but rather with its edges only. Preferentially the hollow form exhibits, on a side facing the tape, at least one section of concave cross section. With w being the width of the tape, the hollow form exhibits preferably an average radius of curvature r of $0.5w \leq r \leq 10w$, particularly preferably $0.6w \leq r \leq 4w$. A preferred embodiment of the mounting element is a tube or aperture with circular or elliptic cross section with at least one section of tape extending inside.

Preferably only short hollow forms are used between which the tape is self-supporting. Particularly preferred short hollow forms are thin plates or foils standing across the tape and having cut-outs or apertures of hollow cross section with at least one section of the tape extending inside. Then the tape can evade the forces of bubble formation, thermal expansion and magnetic fields without buckling or cracking which would destroy it.

In a further embodiment the CC is held at its edge regions with a play implying a clearance of preferentially 5% to 50%, and particularly preferentially of 10 to 30% of the width w of the tape conductor. In this way, the tape has controlled freedom to move. In another embodiment the mounting element exhibits a spring loaded fit for the tape conductor.

Materials that come into question for the mounting elements holding the edges of the tape are preferably insulators like simple plastics, glass-fibre reinforced plastic (GPR), polyimide, ceramics or polyester. However, short mounting elements may also be made from metal, because there is no significant voltage drop on short distances.

According to a further aspect the present invention relates to a current limiter with a tape conductor which is coated with a high temperature superconductor, and with at least one mounting element which is contacting the tape conductor on one or both of its principal surfaces (front or rear surface) in an electrically and thermally conducting way, so that the tape conductor in its normal state will be electrically bypassed or shunted.

A reliable fastening of the tape without play requires an attachment on the principal surface. At the area of contact the access of the coolant is hindered. In order that the tape conductor is not heating up unduly the heat generation in the area of contact must be reduced. This can be achieved by electrically shunting the tape conductor by the mounting element itself in the area of contact. For this purpose the mounting element must consist of electrically conducting material at the area of contact and good electrical contact with the tape must be established. Due to the bypass the current within the normal conducting tape decreases in the contact area. As a consequence, the dissipated electric power decreases and so does the heat generation in the tape. The remaining heat can be conducted to the mounting element via the contact. Therefore the mounting element should exhibit preferably sufficient heat capacity and sufficient thermal contact to the tape conductor so that an overheating of the tape conductor in the touching region is avoided.

The electrical resistance $R_b$ of the bypass should be related to the normal state resistance of the tape along the length of the area of contact, $R_t$. In a preferred embodiment is $R_b \leq R_t$. Then the current in the tape is at least halved and the heat generation is at least quartered. In a particularly preferred embodiment is $R_b \leq 0.5 R_t$. Then less than one third of the current remains in the tape and the heat generation is reduced by a factor of 9. Hence any metallically conducting foil in the thickness range of the tape can serve as the shunting part of the mounting element in contact with the tape.

It is also advantageous to minimize the contact resistance $R_c$ between the tape and the mounting element because it is also heating the tape directly. In a preferred embodiment is $R_c \leq 0.2R_t$, and in a particularly preferred embodiment is $R_c \leq 0.1R_t$. For a tape with Hastelloy® substrate the preferred specific contact resistance is $R_c \leq 1 \cdot 10^{-4}$ $\Omega cm^2$.

The thermal resistance is controlled by the electrical resistances according to the Wiedemann-Franz-Lorentz law and will hence always be sufficiently small. The heat capacity $C_m$ of the shunting part of the mounting element should be also related to that of the tape in the area of contact, $C_t$. In a preferred embodiment is $C_m \geq C_t$. In a specially preferred embodiment is $C_m \geq 2C_t$.

It is further important to establish the mechanical contact between the tape and the mounting element in such a way that it is fitting well but nevertheless the superconductor layer is not unduly deformed or scratched. Therefore, in a preferred embodiment the shunting part of the mounting element consists at least of a soft metal foil laminated onto the tape conductor. Preferably it consists of e.g. from indium, lead, copper, or silver with a thickness preferably at least half of that of the tape conductor, and particularly preferred at least the same as that of the tape conductor. The soft metal foil contacts the tape conductor preferentially on both principal surfaces. Further it is favorable to provide an electric contact between both sides. Therefore the soft metal foil can preferably be wrapped around the tape and fixed by an insulating or conducting clamp.

Such contacting mounting elements can not only be used to fasten the tape conductor but also to establish an electric contact to it, for instance at the ends as current leads, or for other electrical connections. They can also be used for the series- or parallel-connection of two or more tapes or tape sections within a current limiter component. Furthermore, such conducting mounting elements can be favorably used to bypass small defects of the tape, namely scratches or sharp bends. In this case it is not necessary to provide a mechanically supporting structure, but also self-supporting solutions can be advantageous. For instance the defect can be covered with low melting solder, conducting paste, or a conductive foil, preferentially of copper, silver, indium or lead.

In the vicinity of the contact area of the mounting element, the tape is in danger to bend more than allowable or even to buckle when the tape is moving during the limiting state Therefore, beyond the contact area the mounting element exhibits preferably at least one region which has along the tape a bending radius no smaller than the allowed minimum bending radius of the tape conductor, and which has across the tape a hollow cross section which keeps the tape from touching with its principal surfaces. Alternatively, there is at least one additional mounting element of the type holding the edges of the tape placed near to the contacting mounting element such that the controlled play of the former does not allow sharper bending than the allowable minimum bending radius of the tape conductor. A preferred distance between both mounting elements is one half to three times the allowed bending radius of the tape.

The shunting of some sections of the tape conductor leads to a reduction of its total resistance. Therefore the number of such mounting elements should not be too large. Preferentially the ratio between bypassed and free sections should not exceed a ratio of 1:5, and particularly preferentially 1:10.

According to a further aspect the present invention relates to a current limiter with a tape conductor which is coated with a high temperature superconductor where the tape conductor exhibits a configuration which maintains a minimum distance between different sections of the tape and to other mounting parts so that the movement of the tape under the mentioned forces cannot cause different tape sections to touch each other or to touch support structures with the principal surfaces whereby the access of the coolant would be hindered. The configuration with a minimum distance is also required to allow the gas bubbles to move out freely. On the other hand the distance should not be too large because otherwise the volume of the total system will increase unnecessarily. A preferred minimum distance is 10% of the tape width and a particularly preferred minimum distance is 40% of the tape width.

Possible configurations are, for instance, straight conductor sections arranged in parallel, meandering loops, stacks of the latter, single-layer or multi-layer cylindrical solenoids, pancake coils, stacks of the latter, crosswound bobbins, yin-yang or baseball coils, or even irregular clews. The choice of the configuration depends on the particular case according to the spatial arrangement of components and modules in the total system, the potential distribution, the bubble channeling concept and the minimization of magnetic fields.

The moving direction of the tape in the limiting state can be predetermined when the tape exhibits in its initial state a curvature or bend, like in a coil or a spiral. Then the bubble generation, the thermal length expansion, and the magnetic forces essentially cause an outward motion so that the bend will open a little. Also the thermal deformation causes the bend to open somewhat, if the front side of the tape which warms up more rapidly in the limiting state lies on the inner side of the bend. This is preferred anyway in order to minimize the danger of micro crack formation. Thus, the motion is always directed to the outer side of a bend, increasing the radius of curvature.

The self-supported straight sections between neighboring mounting elements can be made relatively long. Preferred lengths of these self-supporting sections are between the 3-fold and the 50-fold of the tape width, and particularly preferred lengths are between the 5-fold and 30-fold tape width. Such straight sections can be stabilized against vibrations by twisting.

The selected configuration must be preferably established by using the mounting elements described above. For this purpose they must be fastened on some appliance. Together, the mounting elements and the fastening appliance are forming the support structure for the tape. The fastening appliance is preferably made of insulating material, e.g. polyimide, PET, GRP, polyester, or ceramics to avoid shorts, electric breakdown, and sparkover.

Finally, according to a further aspect the present invention relates to a current limiter with at least two current limiter components each of which possess at least one section of a tape conductor which is coated with a high temperature superconductor, and with at least one insulating partition wall between the at least two current limiter components. The thickness of the partition walls is preferably dimensioned according to the potential difference and the dielectric strength of the insulating material, preferentially polycarbonate, polyester, polyimide, or GRP. Favored shapes of such partition walls are again hollow forms which keep the tape from touching with its principal surfaces.

One or more current limiter components in parallel or series connection can be combined to a module with a solid frame. Within a module, long lengths of tape can be accommodated. This means on one hand, that large voltages will occur, and on the other hand, that large amounts of gas bubbles arise in the total module in the limiting state. As a consequence, the dielectric strength of the coolant is strongly reduced and the danger of sparkover between different limiter components is particularly large.

In principle, the problem can be always solved by sufficiently large safety clearance. But at higher voltages they become extremely large and lead to bulky systems and high cost. In that case it is preferable to place insulating bulkheads or partition walls between the components. Such walls are preferentially made of insulating material with high dielectric strength, as, e.g., polyimide, polycarbonate or any polyester. These materials have a higher dielectric strength than any coolant, and at the same time they keep the gas bubbles of different components separated so that no continuous gas tunnel for sparkover can occur.

Preferentially the at least two limiter components are submersed in a cooling liquid and are exhibiting separate guiding channels for the gas bubbles that are generated in the limiting state. The channels are preferably long enough so that any sparkover along their lengths is impossible. Then all of them can be joined to a common vessel in which, e.g., the gas is again liquefied and funneled back to the components.

It is particularly preferable when at least two limiter components are arranged in chambers with their bottom sides having at least one opening each for the entrance of the cooling liquid from below. In addition it is preferable to feed also the electrical leads for the components through these openings and to interconnect the leads in the space filled by the cooling liquid below the chambers. The reason is that the gas bubbles generated in the limiting state essentially move upwards, so that the space below the chambers is essentially free of bubbles and the liquid there has still a relatively high dielectric strength even in the limiting state. To keep this space even more bubble-free, it is preferable to cover the openings with bubble barriers which prevent bubbles from dipping down but allow the coolant to essentially penetrate. Such bubble barriers can be realized, e.g., by fine nets, gratings, webs, felts or fleeces made preferably from insulating materials such as glass fibre, polyimide, polyamide, polyester or any other synthetic material.

It is further particularly preferable if sections of the tape conductor are arranged in such a way that the resulting magnetic fields are at least partially compensating each other. Because individual tape sections must be arranged anyway with a distance, the magnetic fields cannot overlap very strongly. Nevertheless it is preferable to choose configurations in which the magnetic fields of the tape sections, loops or windings are compensating each other. Such configurations are for instance stacks of pancake coils with current counterflow in adjacent pancakes or cylindrical solenoids with current counterflow in adjacent layers or stacks of meanders with current counterflow in adjacent layers and/or reversal loops.

Finally, it is preferable if the tape conductor in its current limiting state can develop and sustain an areal power density of at least 50 kW/m$^2$ for a time span of 100 ms and it is particularly preferable if it can develop and sustain without damage at least 250 kW/m$^2$ for a time span of 100 ms. This way it is assured that the voltage drop along the tape conductor in the limiting state is sufficiently large.

SHORT DESCRIPTION OF THE DRAWINGS

Figure 2:
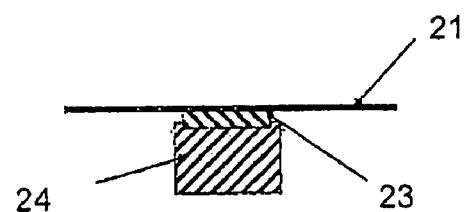
Figure 3:
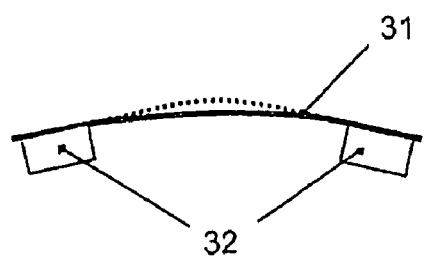
Figure 4A:
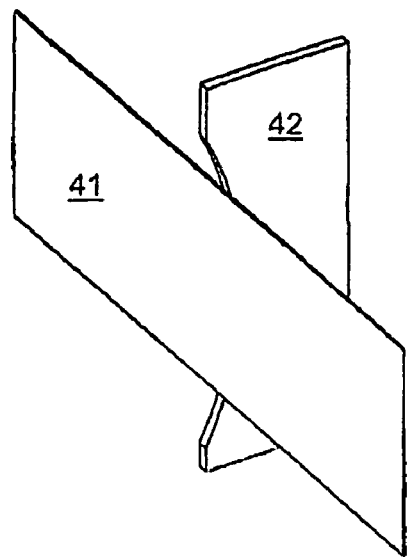
Figure 4B:
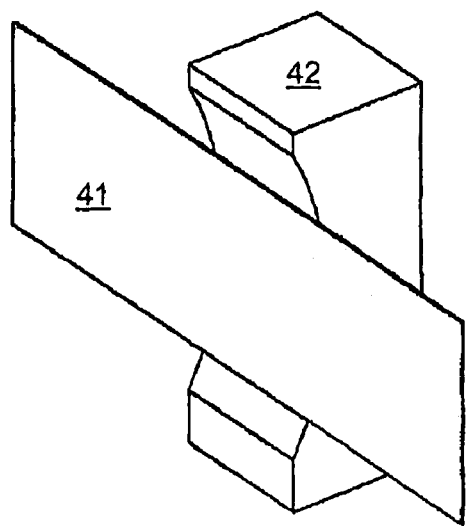
Figure 4C:
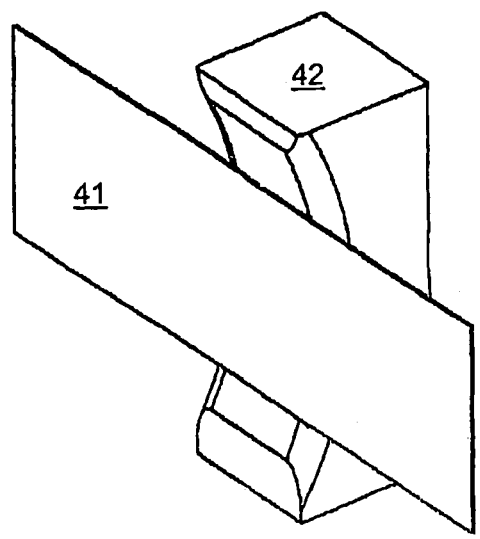
Figure 4D:
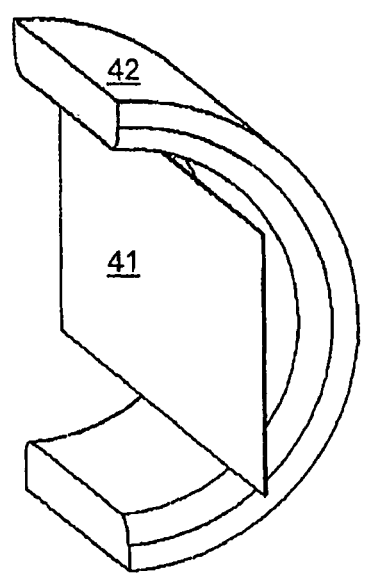
Figure 4E:
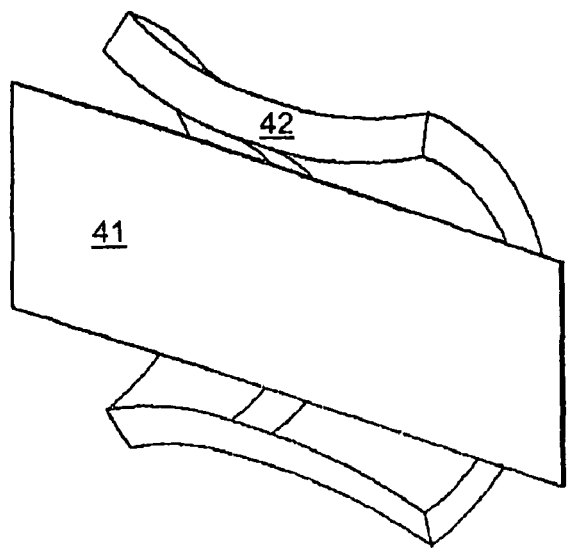
Figure 4F:
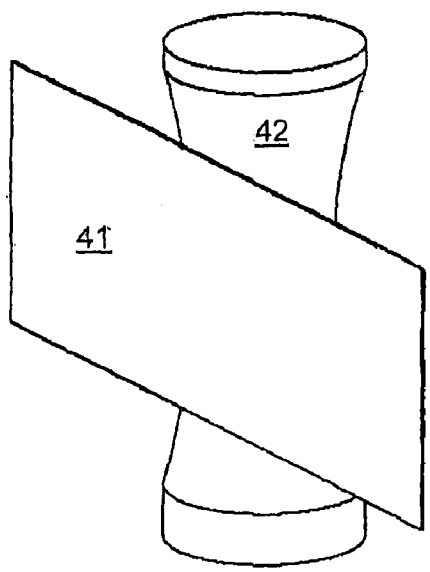
Figure 5:
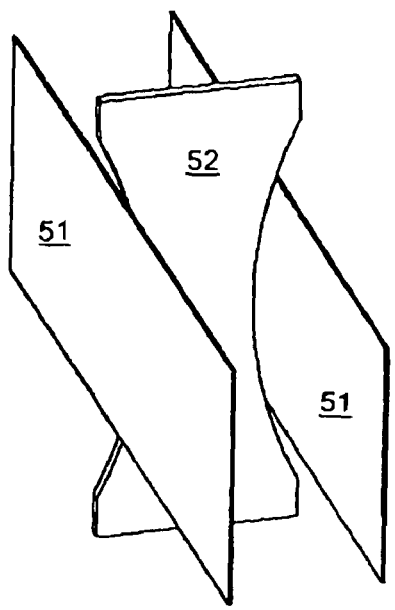
Figure 6A:
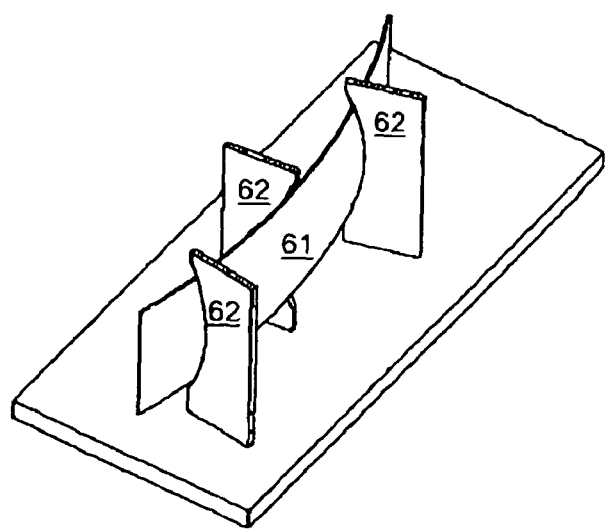
Figure 6B:
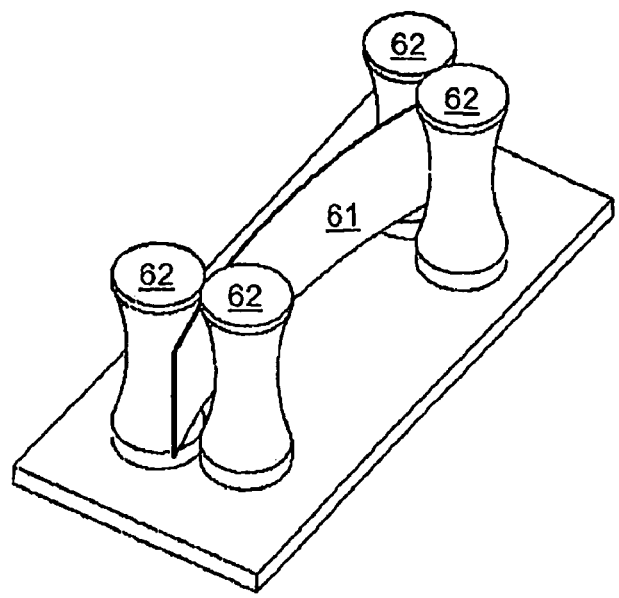
Figure 6C:
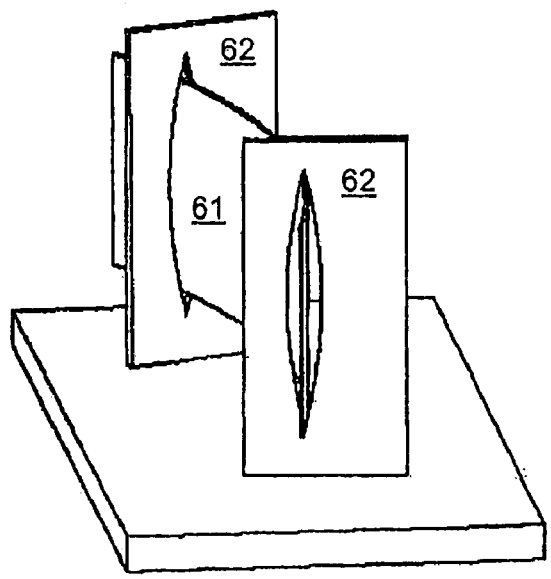
Figure 6D:
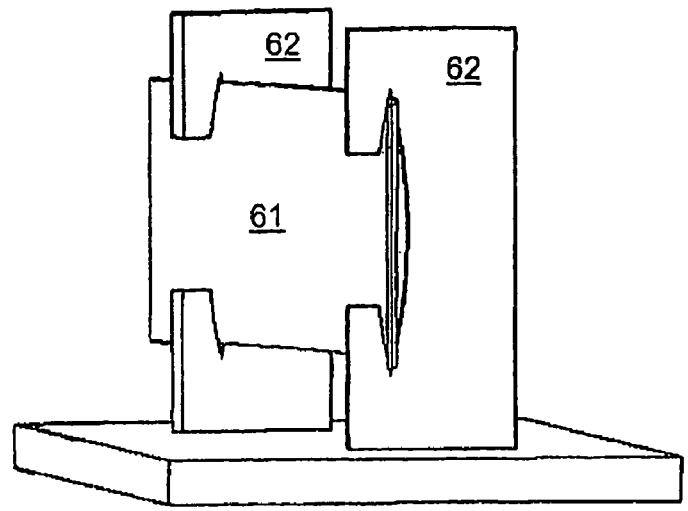
Figure 7:
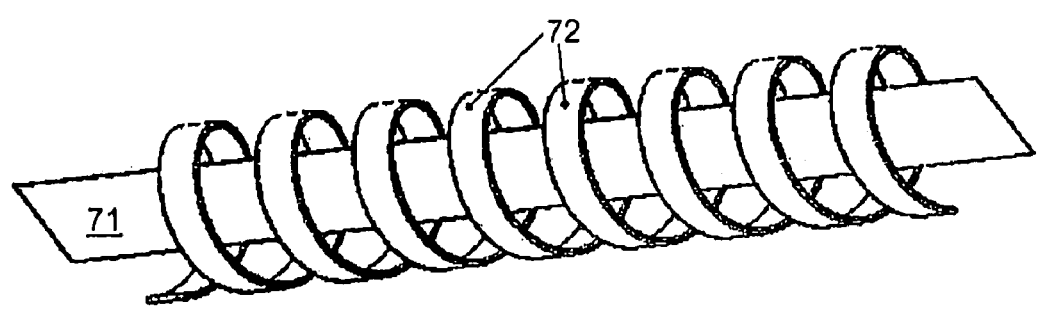
Figure 8:
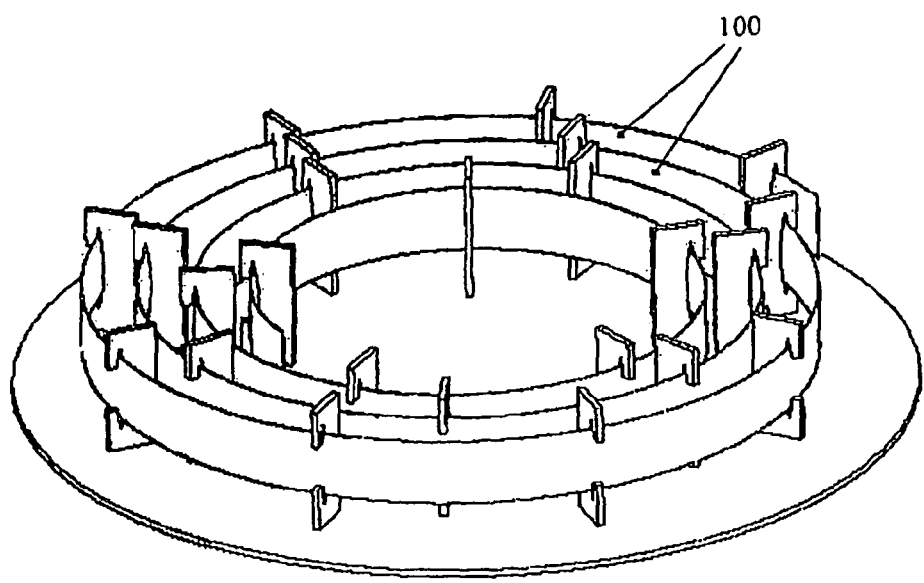
Figure 9:
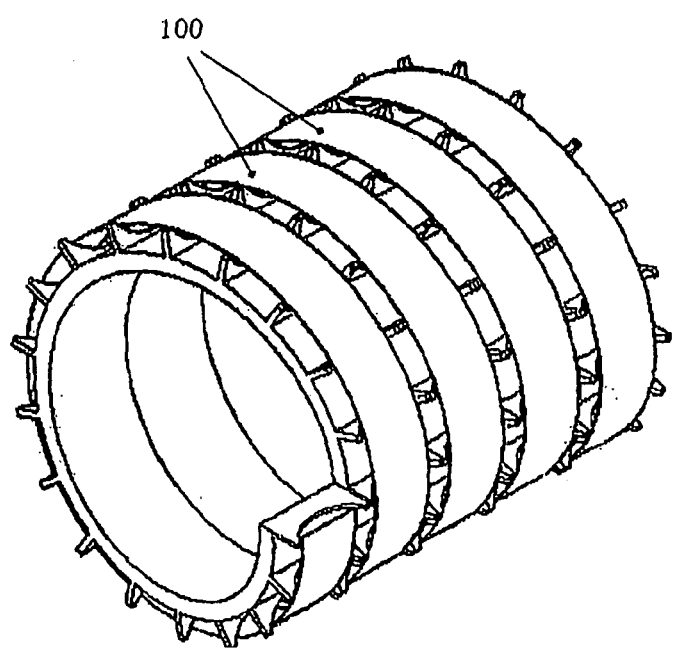
Figure 11A:
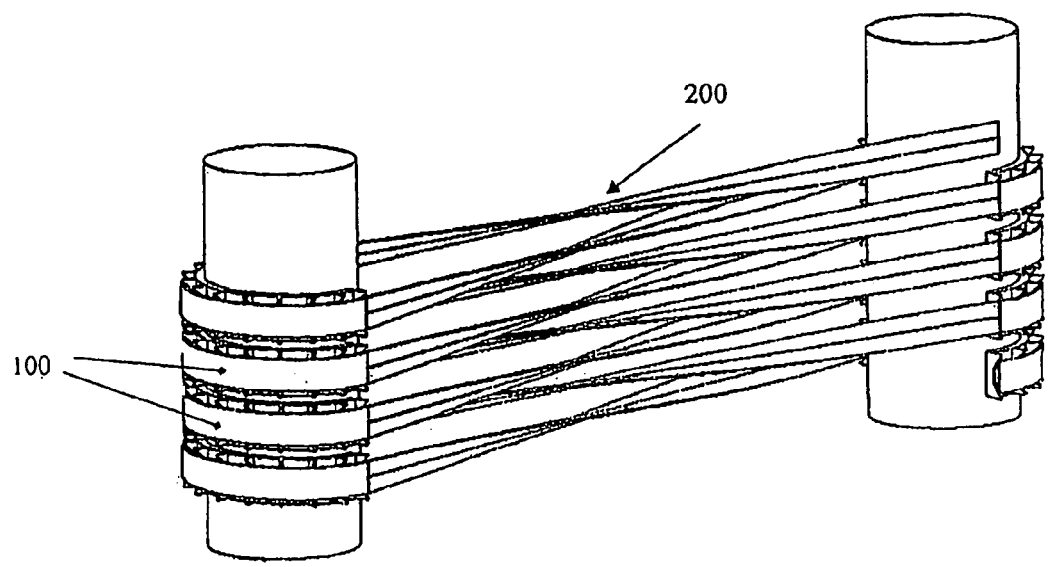
Figure 12:
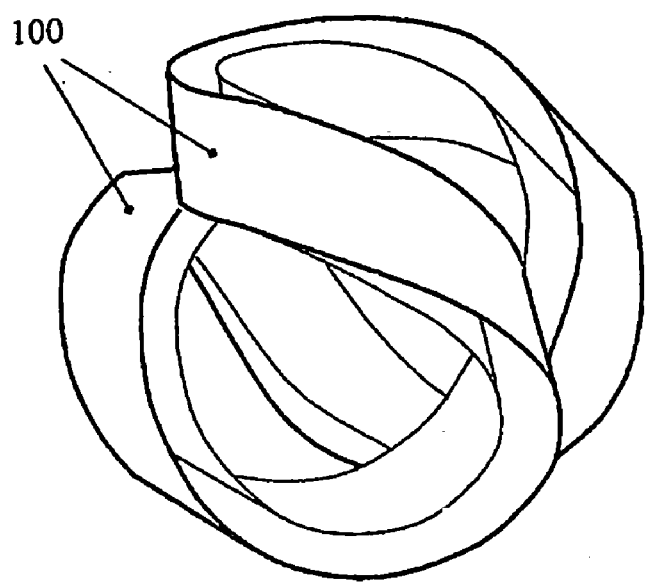

In the following there is a presentation of preferred embodiments of the invention with references to the following accompanying figures:

FIG. 1: Principle of holding a tape conductor at the edges by a hollow form;
FIG. 2 Principle of the fastening a tape conductor by shunting the principal surfaces;
FIG. 3: Self-supporting leg with a bend between two mounts (top view);
FIG. 4a-f: Examples of hollow forms;
FIG. 5: Example of double sided mounting element;
FIG. 6a-d: Bilateral support of the tape conductor by alternating or paired arrangement of mounting elements or by apertures;
FIG. 7: Spiral tube as mounting element;
FIG. 8: Pancake coil of conductor tape;
FIG. 9: Single-layer solenoid of conductor tape;
FIG. 10a-d: Conductor tape formed to various meander arrangements;
FIG. 11a, b: Conductor tape wrapped around two posts;
FIG. 12: Yin—yang- or baseball—coil; and
FIG. 13: Partition of the components at high voltages.

DETAILED DESCRIPTION OF PREFERRED EMBODIMENTS

This section describes presently preferred embodiments of the invention in detail. Thereby the following definitions will be used:

HTS: high temperature superconductor, here in the form of thin films
CC: coated conductor, HTS-coated metal tape
SFCL: superconducting fault current limiter
tape conductor: here synonymous to conductor tape, the tape, and CC
principal surfaces: major or main surfaces; the surface of the CC coated with the superconductor or the opposite surface
edge regions: lateral surfaces of the tape including the edges and including possible margins without HTS coating;
front surface: principal surface with HTS coating (in case of one-sided HTS coating)
rear surface: principal surface without HTS coating (in case of one-sided HTS coating)
tape sections: different sections of the tape which can touch each other or interfere with one another
thermal deformation: elastic or plastic bending caused by differential thermal expansion of the front and rear sides of the tape
support structure: links the tape mechanically to a fixed frame (e.g. a module or a cryostat, see below)
mounting element: the part of the support structure which holds the tape
fastening appliance: rest of the support structure; links the mounting element(s) to a fixed frame (e.g. a module or a cryostat, see below)
limiter component smallest unit of a tape or of several connected tapes with a fastening appliance
module: one or more limiter components assembled in a fixed frame
CC-SFCL: one or more modules assembled in a cryostat, together forming the current limiter based on coated conductors
total system: one or more cryostats (e.g. in a three-phase setup) including the refrigerators and the measuring, controlling and switching equipment
GRP: glass-fiber reinforced plastic
switching: transition of the tape conductor from the superconducting to (the at least partial) normal state
limiting state: state of the limiter in the time span from switching to the opening of the conventional series switch.

An important aspect of the present invention is based on the principle of either holding the tape conductor at its edges or fastening it at its principal surfaces with a conducting metal contact. In the first case the tape conductor has preferentially a controlled play in the mounting element, and in the second case it is firmly mounted and, at the same time, electrically contacted so that it is shunted. Between mounting elements the tape runs self-supported, preferably on most of its length. In the case of edge fixing mounting elements with hollow forms, preferably concave elements are used, so that the principal surfaces of the tape conductor, even when moving, are not able to touch any neighboring structure. The principle is displayed in FIG. 1. Thereby the tape 11 can be fixed with the help of the mounting element 12 in a vertical, horizontal, or any other position.

The principle of fastening by shunting is shown in FIG. 2. The mounting element consists preferably of a shunting part 23 next to the tape and a supporting part 24 that can be fixed to a fastening appliance (not shown). However it is also possible to use only one part 24 which is directly mounted to the fastening appliance.

The tape must be able to move during the expansion, especially when tightly fastened, without buckling or sharp bending. This can be achieved by allowing degrees of freedom for motion between two fixed points. It is particularly preferable if the tape conductor is not following a straight line but exhibits a shallow bend. Then the length expansion can be compensated by an elastic curvature. This principle is shown in FIG. 3.

Next there are some examples of solutions for the assembly of the tape conductor which account for the above principles.

Mounting Elements Holding the Tape at the Edges

Along the length of the tape there are different preferred forms. e.g. thin plates (FIG. 4a), rectangular studs, also with rounded edges (FIG. 4b, 4c), straight tubular pieces (FIG. 4d) or tubes with trumpets attached (FIG. 4e) or round posts (FIG. 4f) In case of the attached trumpets and in case of the round posts the longitudinal radius of curvature is preferably not smaller than the allowed radius of curvature of the tape. This way the tape is protected against undue bending or buckling.

All elements can be made double sided so that either side is holding a tape. This is shown in FIG. 5 for the example of a plate 52. The elements described so far are each holding the tape only on one side. To hold the tape on both sides one must place such elements on both sides of the tape. Preferred are alternating (FIG. 6a) or paired arrangements (FIG. 6b), where the pair can also be integrated into a single element, so as to result in an eye (FIG. 6c). It is advantageous if the eye is not closed but has an opening as in FIG. 6d and consists of sufficiently flexible material. Then the tape can be inserted from the side, which facilitates the assembly. In case of an annular mounting element or a closed eye one can also apply a narrow cut which allows to introduce the tape.

A further preferred shape according to the basic principle of edge mounting, open for the access of coolant, and with fixture on both sides of the tape is an elastic spiral tube 72 made of plastics, as shown in FIG. 7. A spiral tube can be used versatilely for windings or also as insulation for self-supported tape sections with and without twist. The same holds for elastic spirals and round plastic combs known as spines of booklets. Plastic combs are particularly advantageous because the tape can be easily introduced from the side.

Mounting with and without Play

If hollow mounting elements are holding the tape only loosely, as in FIGS. 4-7, then the tape has still a certain play and can displace itself in longitudinal direction and, to a limited degree, change its direction to give way to the forces acting on the tape. This way stronger deformation which would damage the tape conductor is avoided. However, in principle, some of the embodiments can also be used for a relatively rigid mounting of the tape, e.g. the pairwise arrangement or the eye-like elements, whereby the fitting between the tape and the mounting element must be adjusted in such a way that the tape is clamped, but not damaged. This can be preferably achieved by a spring-loaded fit.

Contacting Mounting Elements

The contact between the tape 21 and the shunting part 23 in FIG. 2 can be established preferentially by clamping, by low melting solder, e.g. based on indium, silver, bismuth, or tin, by pressed contacts, by conducting silver paste, by conducting glue, e.g. based on epoxy resin filled with silver. Preferred are pressed contacts with an inlay of a soft metal foil. The soft metal foil is preferentially wrapped around the tape and consists of indium, lead, silver or copper. Further preferred are conducting glues, e.g. based on epoxy resin filled with silver. Particularly preferred among epoxy resins are cold reacting 2-component epoxy resins because they exhibit favourable low temperature properties.

Normally, the supporting part 24 is rigidly linked to the shunting part 23 (e.g. by gluing, screwing, riveting, soldering or clamping). However, it is also possible to provide a link with play. Also self-supporting shunting parts are possible, if a damaged spot is simply concerned.

Tape Configurations

Preferred embodiments of tape configurations for limiter components are exemplified in FIGS. 8-12. In all cases the above mentioned preferred minimum radius must be observed.

FIG. 8 shows a pancake coil which is arranged with open eye mounting elements on a plate of insulating material as fastening appliance. In the same way, all other mounting elements can be considered. The pancake coil shown here has the form of a circular spiral. Other examples are oval spirals or rectangular spirals with rounded corners. Pancake coils can be stacked upon one another. Thereby they are preferably connected in such way that they exhibit current counterflow in adjacent pancakes, so that the magnetic fields can compensate each other.

Figure 10A:
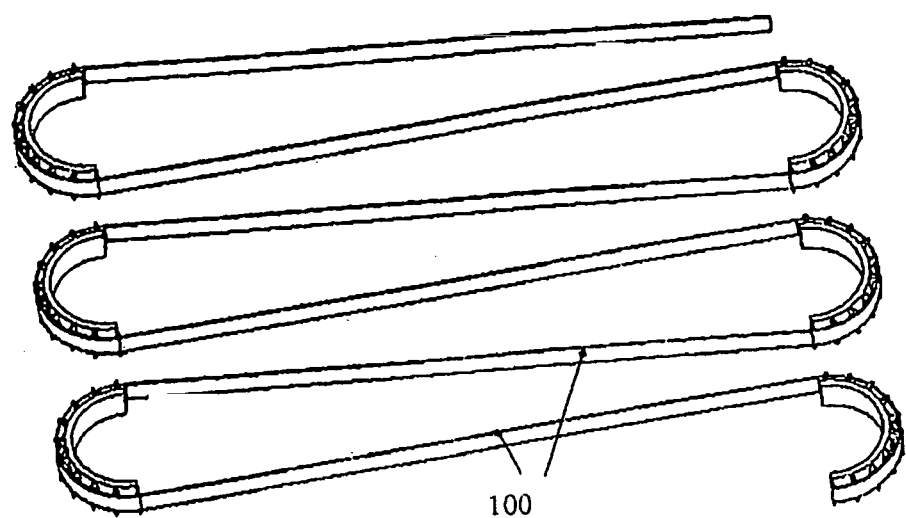
Figure 10B:
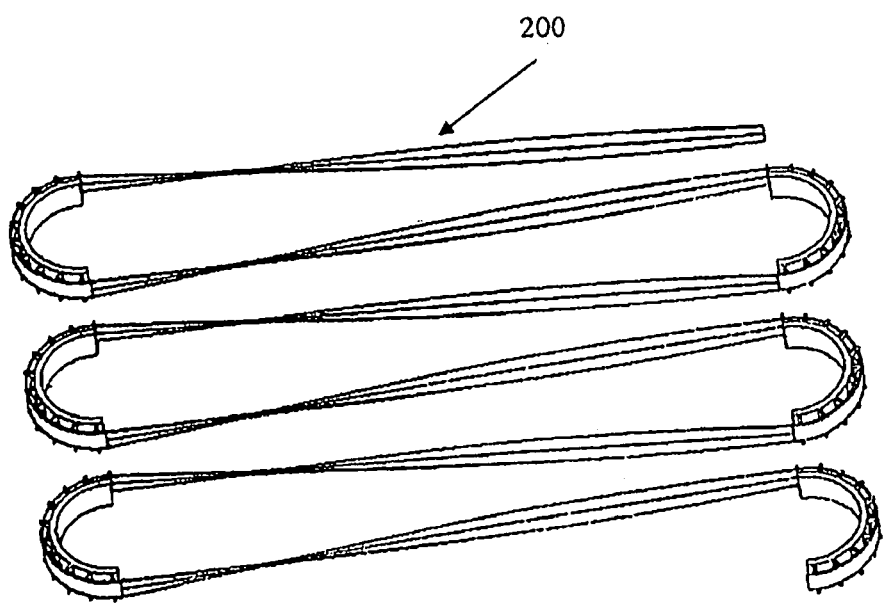

FIGS. 10a and 10b show single-layer meanders whose curved sections are held by thin plates which are attached to short half-tubes. In FIG. 10b the self-supporting straight sections 200 of the tape are twisted by 180° each. This is advantageous because the front side of the tape is always in the inner bend and the HTS—film is under compression. Furthermore, the twisting serves as mechanical stabilization of the tape, particularly against vibration. By twisting the edges of the tape are stretched and the middle axis of the tape is squeezed. Thereby the maximum deformation $\epsilon_{max}$ of the tape must not be exceeded. A calculation yields a minimum acceptable pitch $$p_{min} = \frac{\pi \cdot w/2}{\sqrt{\epsilon_{max}}},$$

where w is the tape width. For example with w=10 mm and $\epsilon_{max}$=0.2% the minimum acceptable pitch is about 350 mm, corresponding to a free length of 175 mm for a 180° twist. This formula has stood the test of practice.

Figure 10C:
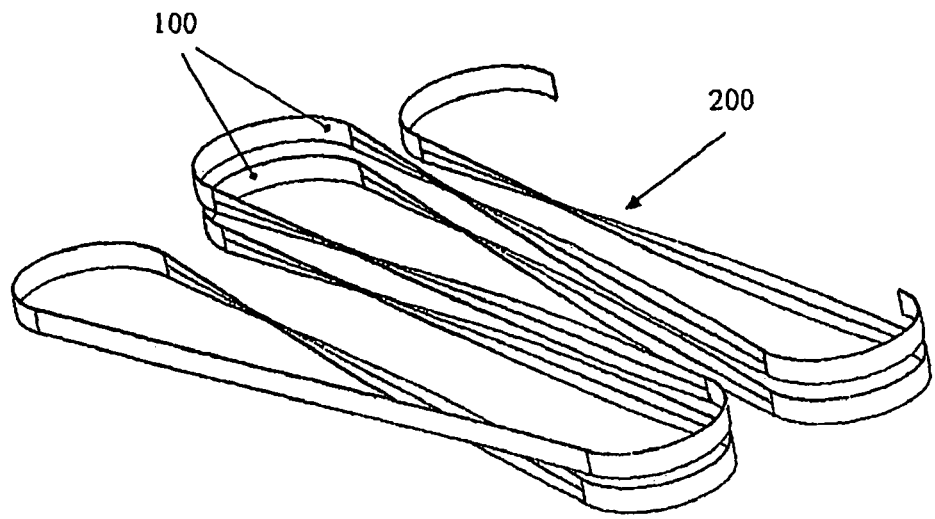
Figure 10D:
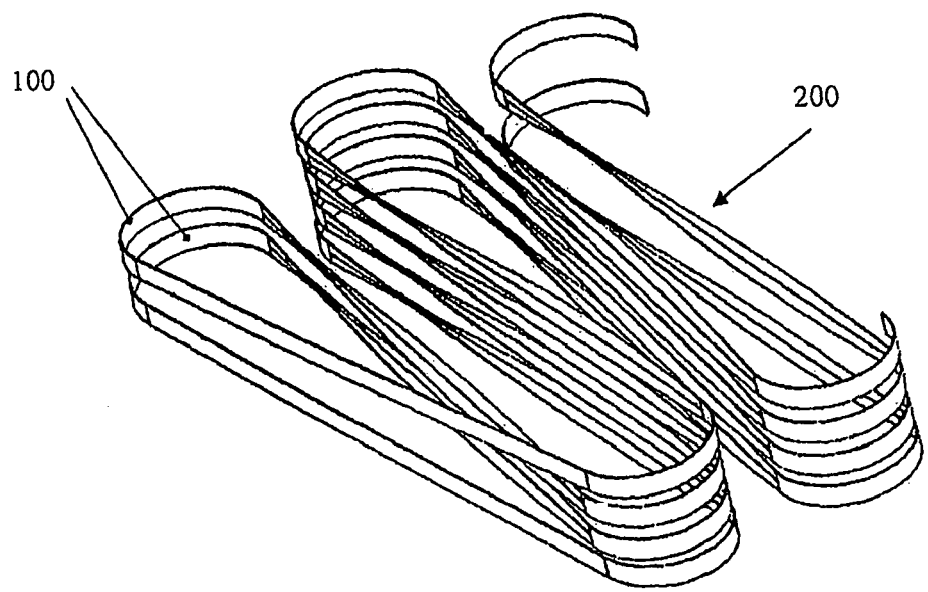
Figure 11B:
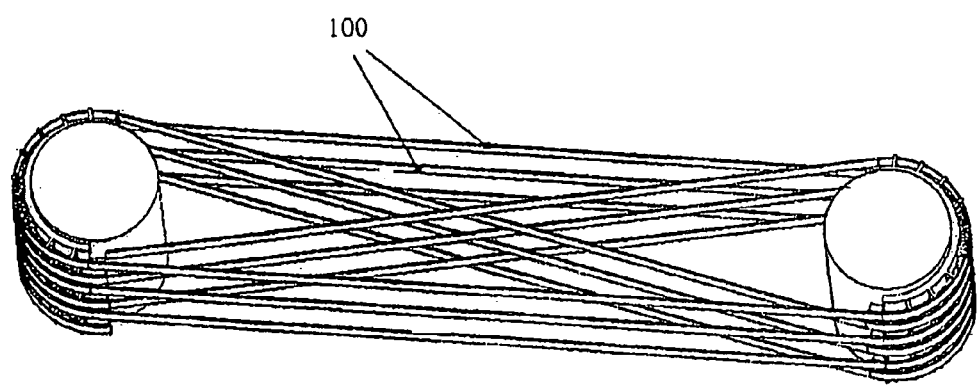

Meanders can be stacked on one another. FIG. 10c shows two layers of a meander stack. The posts are not shown here for clarity. Between both layers there is a reversal loop without twist. This way the front side of the tape can always be on the inner side of all curved sections, and, in addition, the current is in counterflow. The latter does not hold for the reversal loop. To get two reversal loops in counterflow requires at least 4 layers of the meander stack. FIG. 10*d* shows how to arrange them. For a flat and compact arrangement the tape can be further wrapped around two posts. The result is depicted in FIG. 11*a*. By the twist the sections can cross in the middle without touching, and the front side can always lie on the inner side. The magnetic fields are compensating even better and the insulation distances become larger if the crossings are made only intermittently as shown in FIG. 11*b*. However, the crossing tape sections should be again twisted—in contrast to the figure—in order to allow the front side to lay always on the inner side.

A further configuration with a small magnetic self-field is the so called baseball coil or yin-yang coil, as shown in FIG. 12.

In the embodiment relating to FIGS. 8-12 adjacent tape sections 100 are always exhibiting a minimum distance of more than 10%, preferably more than 40% of the width of the tape conductor. This way it is prevented that the formation of bubbles during the limiting state leads to an undue deformation of the tape conductor. The above limits for the minimum distance ensure that the bubbles can essentially escape freely.

Guidance of Gas Bubbles

Figure 13:
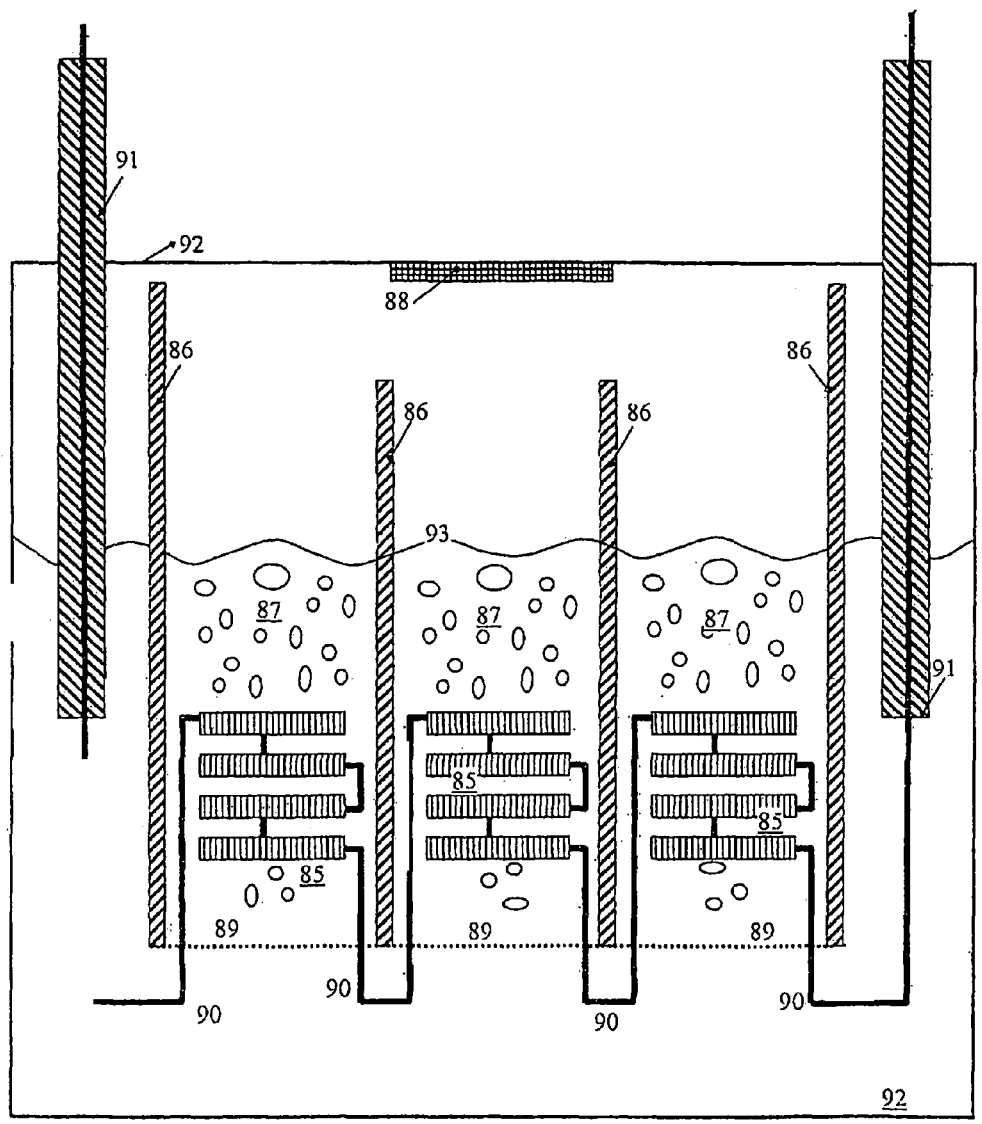

At high voltages it is advantageous to use partition walls for the separation of components at different potentials, preferably when the potential difference exceeds 1 kV and particularly preferably when exceeding 2 kV, in order to supersede large safety distances for a more compact and less expensive design. FIG. 13 shows a preferred arrangement. As an example there are three limiter components 85 depicted as pancake coils. Each component 85 is located in a separate chamber formed by partition walls 86. Each chamber is preferably extended to the top and serves there as a bubble channel or chimney 87 leading to a common gas vessel with cooling surface 88. The bubble channels must be chosen long enough so that sparkover in the gas can be safely excluded. Attached to the gas vessel is preferably also a surge tank (not shown).

At the bottom side of each chamber is a net 89 which covers the opening as a bubble barrier. In this way the interconnects 90 of the components are placed below the chambers in a bubble free cooling liquid with high dielectric strength. Also the current leads 91 which are conducted in particularly separated chambers and which can consist of HTS material in the range of the coolant for not causing undue losses. The total arrangement is located in a fixed frame which is exemplified in FIG. 13 as a cryostat which contains the cooling liquid.

LIST OF REFERENCE SYMBOLS tape conductor (CC): 11, 21, 31, 41, 51, 61, 71
mounting element: 12, 32, 42, 52, 62, 72
shunting part: 23
supporting part: 24
limiter components: 85
partition walls: 86
bubble channel or chimney with gas bubbles: 87
cooling surface: 88
net as bubble barrier: 89
interconnects: 90
current leads with high voltage feed throughs: 91
cryostat or module wall: 92
level of cooling liquid: 93
adjacent tape sections: 100
straight tape section with twist: 200

The invention claimed is:

1. Current limiter comprising:
    a tape conductor coated with a high temperature superconductor;
    at least one mounting element which holds the tape conductor which is essentially holding the tape conductor solely at one or more edge(s) in such a way that the principal surfaces of the tape cannot get in touch with the mounting element, and
    wherein the mounting element comprises a hollow form, and the tape conductor extends inside the hollow form.

2. Current limiter according to claim 1, wherein the hollow form of the mounting element comprises on a side facing the tape conductor at least one section of concave cross section.

3. Current limiter according to claim 2, wherein the tape conductor exhibits a width w and the hollow form exhibits an average radius of curvature r and characterized by $0.5w \leq r \leq 10w$.

4. Current limiter according to claim 2, wherein the tape conductor exhibits a width w and the hollow form exhibits an average radius of curvature r and characterized by $0.6w \leq r \leq 4w$.

5. Current limiter according to claim 1, wherein the mounting element is formed as a recess or aperture in a plate, or as a tube having a circular or oval cross section through which as least one section of the tape conductor extends.

6. Current limiter according to claim 1, wherein the tape conductor is held at its edges with a play implying a clearance of 5% to 50% of the width w of the tape conductor.

7. Current limiter according to claim 1, wherein the tape conductor is held at its edges with a play implying a clearance of 10% to 30% of the width w of the tape conductor.

8. Current limiter according to claim 1, wherein the mounting element exhibits a spring loaded fit for the tape conductor.

9. Current limiter according to claim 1, wherein the tape conductor has at least one region with at least two neighboring tape sections; and
    wherein the neighboring tape conductor sections of the tape conductor have a distance from each other of more than 10% of the tape width of the tape conductor.

10. Current limiter according to claim 1, wherein the tape conductor has at least one region with at least two neighboring tape sections; and
    wherein the neighboring tape conductor sections of the tape conductor have a distance from each other of more than 40% of the tape width of the tape conductor.

11. Current limiter according to claim 9, wherein the tape conductor has a coil-, a spiral-, and/or or a meander-like configuration.

12. Current limiter comprising:
    a tape conductor coated with a high temperature superconductor;
    at least one mounting element which holds the tape conductor which is essentially holding the tape conductor solely on one or more edge regions in such a way that the principal surfaces of the tape cannot get in touch with the mounting element,
    wherein the mounting element comprises a hollow form, and the tape conductor extends inside the hollow form;
    wherein the hollow form of the mounting element comprises on a side facing the tape conductor at least one section of concave cross section; and wherein the tape conductor exhibits a width w and the hollow form exhibits an average radius of curvature r and characterized by $0.5w \leqq r \leqq 10w$.

13. Current limiter comprising:

a tape conductor coated with a high temperature superconductor;

at least one mounting element which holds the tape conductor which is essentially holding the tape conductor solely on one or more edge regions in such a way that the principal surfaces of the tape cannot get in touch with the mounting element, wherein the mounting element comprises a hollow form, and the tape conductor extends inside the hollow form;

wherein the hollow form of the mounting element comprises on a side facing the tape conductor at least one section of concave cross section; and wherein the tape conductor exhibits a width w and the hollow form exhibits an average radius of curvature r and characterized by $0.6w \leqq r \leqq 4w$.

* * * * *